US012677678B2

(12) United States Patent
Boo et al.

(10) Patent No.: US 12,677,678 B2
(45) Date of Patent: Jul. 7, 2026

(54) SEMICONDUCTOR ASSEMBLIES WITH SYSTEMS AND METHODS FOR USING AN INTERCHANGEABLE INTERPOSER TO CONNECT DIE TO COMMON SUBSTRATE

(71) Applicant: Micron Technology, Inc., Boise, ID (US)

(72) Inventors: Kelvin Tan Aik Boo, Singapore (SG); Hong Wan Ng, Singapore (SG); Seng Kim Ye, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 416 days.

(21) Appl. No.: 18/111,517

(22) Filed: Feb. 17, 2023

(65) Prior Publication Data

US 2023/0282588 A1    Sep. 7, 2023

Related U.S. Application Data

(60) Provisional application No. 63/315,877, filed on Mar. 2, 2022.

(51) Int. Cl.
| | |
|---|---|
| *H10W 70/60* | (2026.01) |
| *H10B 80/00* | (2023.01) |
| *H10W 70/05* | (2026.01) |
| *H10W 70/62* | (2026.01) |
| *H10W 70/65* | (2026.01) |
| *H10W 90/00* | (2026.01) |

(Continued)

(52) U.S. Cl.
CPC .......... *H10W 70/611* (2026.01); *H10B 80/00* (2023.02); *H10W 70/093* (2026.01); *H10W 70/641* (2026.01); *H10W 70/65* (2026.01); *H10W 90/00* (2026.01); *H10W 90/401* (2026.01); *H10W 90/701* (2026.01); *H10W 72/865* (2026.01); *H10W 72/884* (2026.01); *H10W 74/15* (2026.01); *H10W 90/724* (2026.01); *H10W 90/732* (2026.01); *H10W 90/734* (2026.01); *H10W 90/752* (2026.01); *H10W 90/754* (2026.01)

(58) Field of Classification Search
None
See application file for complete search history.

(56) References Cited

U.S. PATENT DOCUMENTS

2013/0032390 A1*  2/2013  Hu ...................... H10W 70/698
                                                              174/266
2017/0047308 A1*  2/2017  Ho ...................... H01L 23/5386
(Continued)

*Primary Examiner* — Cory W Eskridge
(74) *Attorney, Agent, or Firm* — Dorsey & Whitney LLP

(57) ABSTRACT

Semiconductor device assemblies having redistribution structures, and associated systems and methods, are disclosed herein. In some embodiments, a semiconductor device assembly includes a substrate, a controller, and an interposer. The substrate has a top surface and a bottom surface. A cavity extends below the top surface. The controller has a first pin-out pattern. The interposer has a top surface with the first pin-out pattern that is directly connected to the controller and a bottom surface that has a second pin-out pattern. The interposer interconnects the first and second pin-out patterns, and the interposer and the second pin-out pattern are configured to be directly attached to a surface of the substrate in the cavity.

15 Claims, 10 Drawing Sheets

(51) Int. Cl.
    *H10W 72/00*         (2026.01)
    *H10W 74/15*         (2026.01)

(56)             References Cited

U.S. PATENT DOCUMENTS

| | | | |
|---|---|---|---|
| 2019/0067205 A1* | 2/2019 | Rae | H10W 42/20 |
| 2019/0181093 A1* | 6/2019 | Dominguez | H01L 21/486 |
| 2019/0393168 A1* | 12/2019 | Park | H10W 42/121 |
| 2020/0020624 A1* | 1/2020 | Kang | H10W 90/401 |
| 2022/0285255 A1* | 9/2022 | Peng | H05K 3/4694 |

* cited by examiner

SEMICONDUCTOR ASSEMBLIES WITH SYSTEMS AND METHODS FOR USING AN INTERCHANGEABLE INTERPOSER TO CONNECT DIE TO COMMON SUBSTRATE

CROSS-REFERENCE TO RELATED APPLICATION(S)

The present application claims priority to U.S. Provisional Patent Application No. 63/315,877, filed Mar. 2, 2022, the disclosure of which is incorporated herein by reference in its entirety.

TECHNICAL FIELD

The present technology is directed to semiconductor device packaging. More particularly, some embodiments of the present technology relate to techniques for allowing a common substrate to be used with multiple controllers that have different pin-out patterns.

BACKGROUND

Semiconductor device assemblies, such as hybrid packages that include a controller die or chip and multiple memory dies, are used for a variety of applications. Compact implementations are desired to increase density and/or height of attached chips and die stacks, and to facilitate increased functionality to meet operating parameters.

Each controller die can have a different pin-out pattern or pillar (e.g., bump) array layout, requiring the fabrication of a unique substrate that accepts the controller. This increases cost, complexity, and inventory management as multiple substrates are required to accommodate the different controllers, even when the desired memory die configuration may be the same.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Figure 1A:
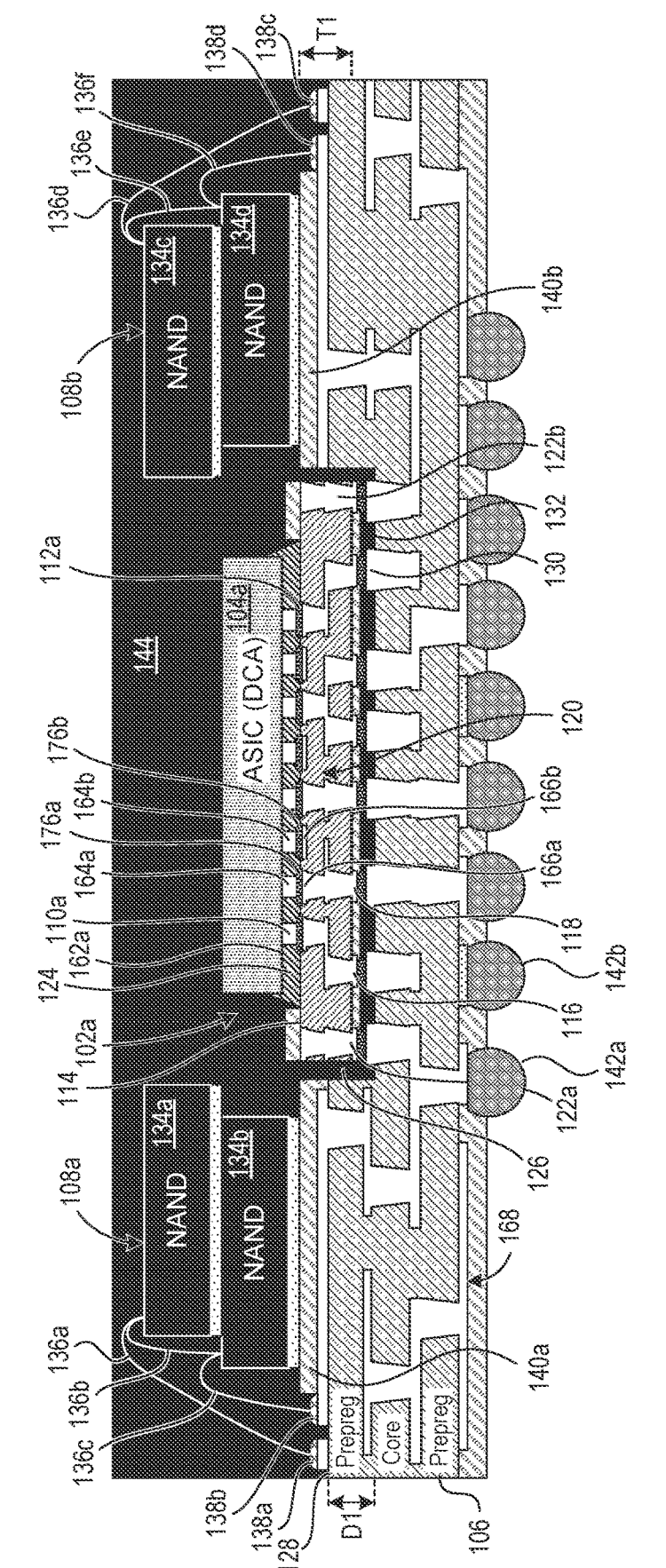
FIG. 1A is a side cross-sectional view of a semiconductor device assembly that has an interposer interconnecting a controller and a substrate in accordance with the present technology.

An interposer (e.g., adapter) can be used to connect a controller to a hybrid package that includes a substrate and memory dies or chips (e.g., NAND dies). The substrate has a cavity that accepts at least part of the interposer. The interposer is electrically connected to the substrate via a common or universal pin-out pattern that can be different than the pin-out pattern of the controller, and the interposer redistributes the pin-out pattern of the controller to the pin-out pattern of the substrate. Because controllers have different pin-out patterns, different interposers are used to electrically connect a particular controller to the substrate. This provides the advantage of having a common hybrid package, e.g., the same substrate and memory chip configuration, able to accept different controllers with varying dimensions and pin-out patterns. This configuration improves overall product and design cycle time, while also providing lower cost through modular design.

Also, current substrate technology that includes a core layer has a larger pitch limitation, requiring fairly large pads that are not compatible with a fine pitch of the direct chip attach (DCA) technology of the controller. Therefore, the substrate technology is unable to meet current fanout flip chip controller bump pitch. The interposer provides the advantage of embedding the traces into a more flexible layer, such as by using an embedded trace substrate (ETS) that may incorporate prepreg. The interposer is fabricated separately from the substrate, rather than layering the traces on or within the surface of the substrate. The pitch pin-out pattern of the controller is re-mapped or redistributed to a different and/or wider pin-out pattern that is provided on an opposite side of the interposer. Accordingly, once the device assembly that includes the interposer and controller are mounted on the substrate, package stiffness can be maintained by using a substrate that includes a stiff core layer.

An additional expected advantage of the embodiments shown and discussed herein is that there is room to position memory dies on both sides of the controller. The cavity in the substrate can reduce a height (e.g., Z dimension) of the controller and interposer combination. The reduction in height allows additional NAND dies to be shingled in adjacent die stacks without physical restraint of the controller in the X and Y dimensions. Lowering the height of the controller overall results in the advantage of reduced interference between the shingled dies and the controller, and NAND dies can be placed closer to the controller because the redistribution of the signals between the controller and the substrate is accomplished within the interposer rather than on the surface of or within the substrate.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-5. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below", "top", and "bottom" can refer to relative directions or positions of features in the semiconductor devices in view of the orientation shown in the Figures. For example, "upper", "uppermost", or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Also, as used herein, features that are, can, or may be substantially equal are within 10% of each other, or within 5% of each other, or within 2% of each other, or within 1% of each other, or within 0.5% of each other, or within 0.1% of each other, according to various embodiments of the disclosure.

FIG. 1A illustrates an overview of the present technology, while FIGS. 1B-9 illustrate further details of the present technology. Like reference numbers relate to similar components and features in FIGS. 1A, 1B, 3, 4, and 6-8. The present technology addresses the technical problem of requiring a unique substrate that has a pin-out redistribution customized for each controller, which is expensive to design and fabricate, as well as increasing the inventory management burden.

Figure 1B:
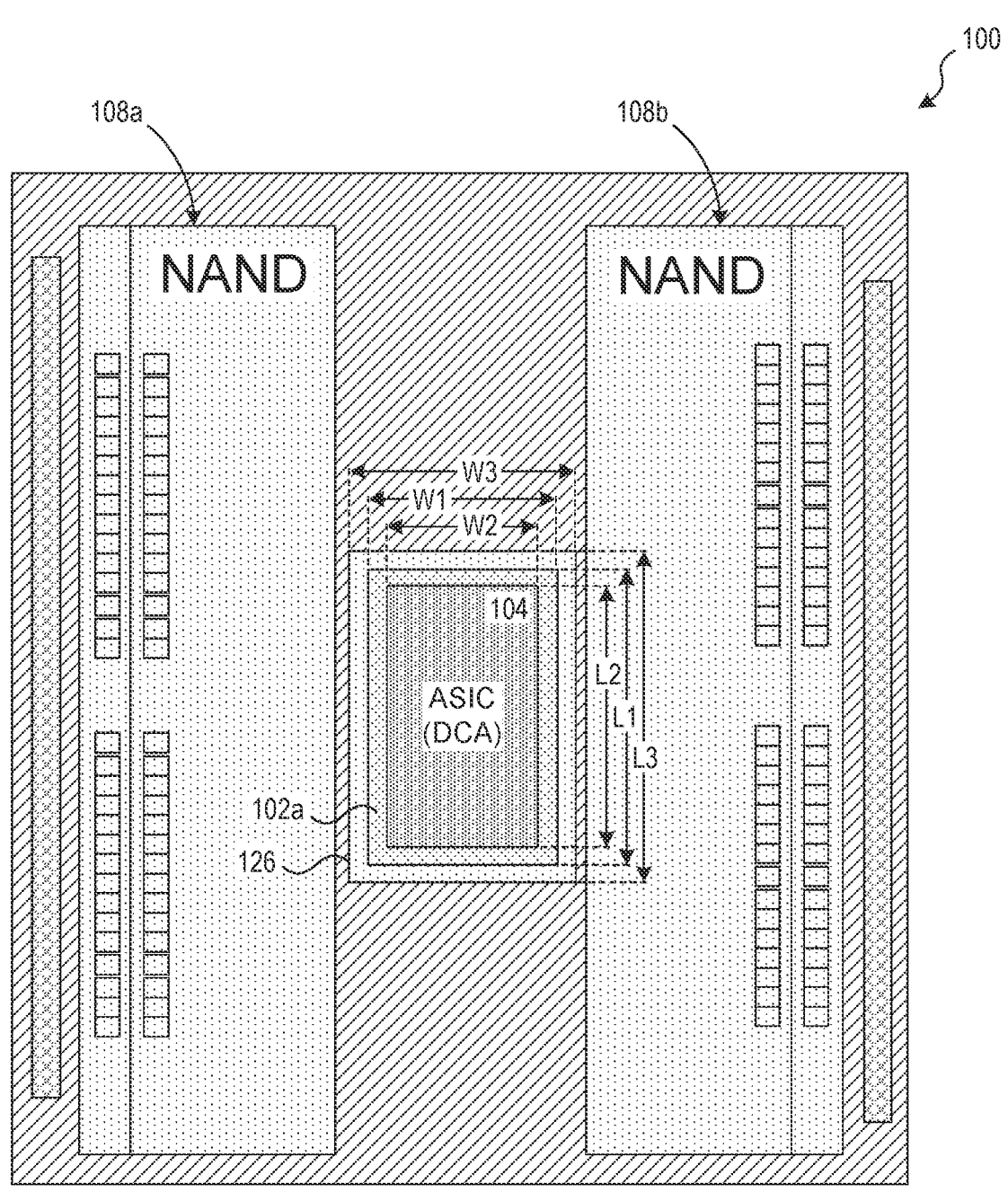
FIG. 1B is a top-down view of footprints of some of the components of the semiconductor device assembly of FIG. 1A in accordance with the present technology.

FIGS. 1A and 1B illustrate a semiconductor device assembly 100 in accordance with embodiments of the present technology. More specifically, FIG. 1A is a side cross-sectional view of the semiconductor device assembly 100 that has an interposer 102a that interconnects a controller 104a and a substrate 106, while FIG. 1B is a top-down view of footprints of some of the components of the semiconductor device assembly 100.

The controller 104a is interconnected to the substrate 106 via the interposer 102a that is positioned between first and second die stacks 108a, 108b. The controller 104a can be, for example, an application specific integrated circuit (ASIC). Each controller 104a can have a unique pin-out pattern 110a, e.g., the pin-out pattern 110a can be different based on vender, design requirements, preference, etc.

Each controller 104a can be paired with the interposer 102a that has a matching pin-out pattern 112a on its top surface 114 that corresponds to the pin-out pattern 110a of the controller 104a, which is discussed in detail further below in FIG. 8. The interposer 102 is an "adapter" that redistributes the signals of the pin-out pattern 112a on the top surface 114 of the interposer 102a (e.g., the same pin-out pattern 110a on bottom surface 162a of the controller 104a) to a different, universal pin-out pattern 116 on a bottom surface 118. The controller 104a and the interposer 102a can be attached together into a discrete device assembly before being mounted on the substrate 106. In other embodiments, the interposer 102a can be mounted on the substrate 106 and the controller 104a subsequently mounted to the interposer 102a. The interposer 102a can be, for example, an embedded trace substrate (ETS), fanout technology, or other remote distribution layer (RDL).

Figure 6:
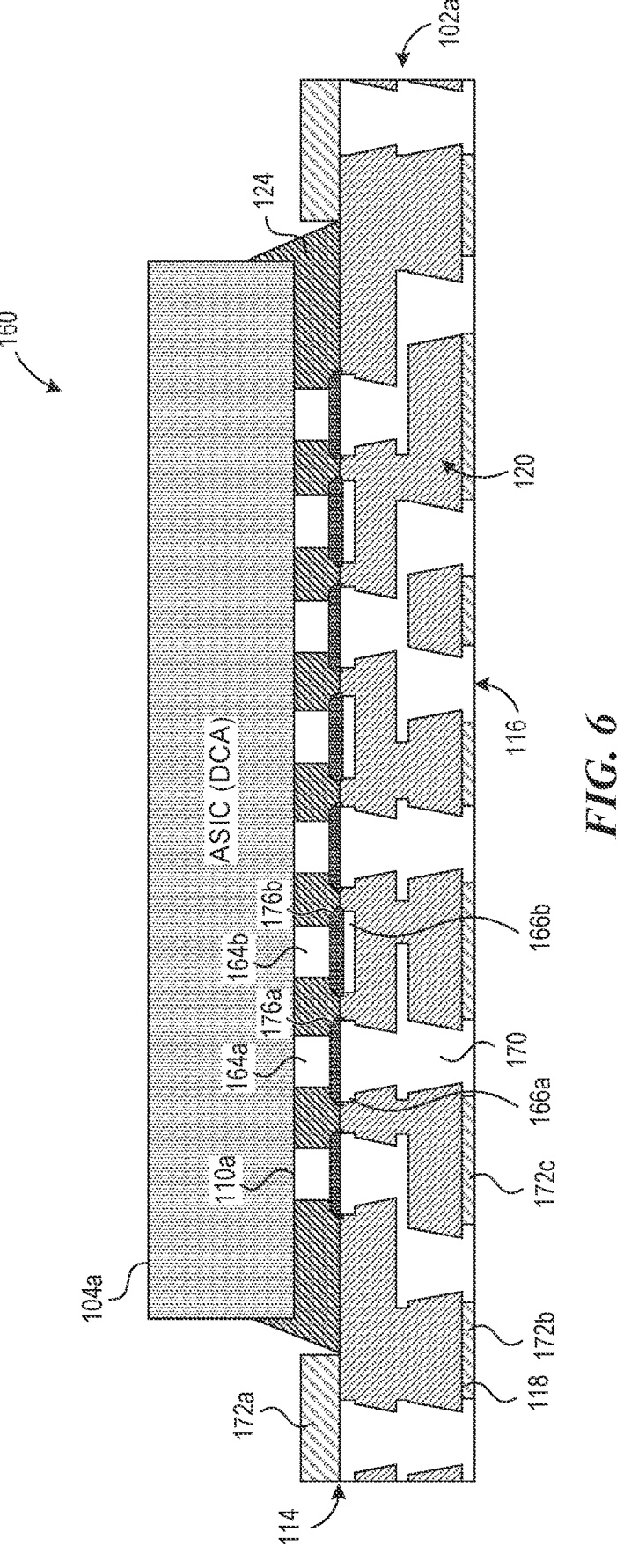
FIG. 6 is a side cross-sectional view of the device assembly that includes the interposer interconnected with the controller in accordance with the present technology.

A redistribution pattern 120 that is formed within the interposer 102a redistributes or re-maps contacts of the pin-out pattern 112a on the top surface 114 to the different pin-out pattern 116 on the bottom surface 118 of the interposer 102, as shown in FIGS. 1A and 6. The representation of the redistribution pattern 120 is simplified and does not show all interconnections. Further, each different controller 104a can have an associated interposer 102a with a correspondingly different redistribution pattern 120, wherein each of the interposers 102a will have the same pin-out pattern 116 on the bottom surface 118.

In other words, the redistribution pattern 120 within the interposer 102a is specific to the pin-out pattern 112a on the top surface 114 and the pin-out pattern 116 on the bottom surface 118. Therefore, a first interposer 102 that is configured to be used with a first controller 104 can have a first redistribution pattern 120, while a second interposer 102 that is configured to be used with a second controller 104 can have a second redistribution pattern 120 that is different than the first redistribution pattern 120. However, both the first and second interposers 102 have the same second pin-out pattern 116 (e.g., the universal pin-out pattern) to allow interconnection with the same substrate 106.

The interposer 102a provides increased space to reroute the finer or tighter pitch of the pin-out pattern 110a of the controller 104a to the common or universal pin-out pattern 116 that can have larger or wider pitch dimensions. The universal pin-out pattern 116 can be defined by the optimal stack-up and layout for each NAND design ID.

The interposer 102a can include other structures, such as stacked through-vias 122a, 122b. The via(s) 122a, 122b can connect to distributed signal(s), reroute a trace to a different pitch location, etc. Therefore, the through-via(s) 122a, 122b can be connected to other traces (not shown) within or on the substrate 106. Other elements (not shown) can also be included in the interposer 102a.

In some embodiments, the controller 104a can be a flip-chip design and be connect to the interposer 102a using DCA. For example, the controller 104a can have electrical interconnects 164a, 164b (not all of the electrical interconnects 164 are separately indicated). The electrical interconnects 164a, 164b can be, for example, conductive bumps, solder bumps, copper pillar bumps, copper pillar solder bumps, etc., that are connected to corresponding conductive pads 166a, 166b (not all of the conductive pads 166 are separately indicated) on the interposer 102a with, for example, solder 176a, 176b. Not all of the electrical interconnects 164 are shown. Underfill 124, such as a capillary underfill, can be flowed between the controller 104a and the interposer 102a.

A cavity 126 extends a depth D1 below a top surface 128 of the substrate 106 and accepts at least a portion of the interposer 102a. Therefore, the interposer 102a can be at least partially recessed into the cavity 126 in the substrate 106, thus providing the advantage of offsetting at least a portion of the additional height that is added with the interposer 102a. In some embodiments, the depth D1 can hold a portion of a thickness T1 of the interposer 102 such that the top surface 114 of the interposer 102a extends above the top surface 128 of the substrate 106, while in other embodiments, the top surface 114 of the interposer 102a can be approximately level with or below the top surface 128 of the substrate 106, wherein the interposer 102a can be fully recessed into the cavity 126.

In other embodiments, the interposer 102a can be directly attached to a pin-out pattern (not shown) on the top surface 128 of the substrate 106 without being recessed into a cavity 126. Although this configuration increases the height associated with the controller 104a, this configuration may be possible with some controllers 104a (e.g., smaller-sized controllers 104a) or other configurations that do not physically interfere with surrounding components, such as the shingled die stacks 108a, 108b. Also, even though the Z or height dimension may be increased in this embodiment, the X and/or Y requirements may decrease as the remapping of the controller outputs to the substrate 106 occur both horizontally and vertically within the interposer 102, rather than, for example, being implemented on the top surface 128 of the substrate.

As shown in FIG. 1B, the interposer 102a has a length L1 and width W1 that are greater than a length L2 and width W2 of the controller 104a, although in some embodiments the length L2 and/or width W2 of the controller 104a can be approximately the same size as those of the interposer 102a. In other embodiments, the length L1 and/or width W1 of the interposer 102a can be less than those of the controller 104a, as long as the interposer 102a has a footprint large enough to interconnect with the pin-out pattern 110a of the controller 104a. The cavity 126 has a length L3 and width W3 that are greater than the length L1 and width W1 of the interposer 102. In general, the length L3 and width W3 of the cavity 126 are large enough to accommodate each of the interposers 102 associated with any of the desired controllers 104 which can have varying sizes. Accordingly, a common primary substrate 106 provides the advantage of use with multiple different controllers 104 through the interconnection of the interposer 102, and thus can be used in multiple different devices for different applications.

Returning to FIG. 1A, the bottom surface 118 of the interposer 102a has the pin-out pattern 116 that substantially matches (e.g., aligns with) a pin-out pattern 130, which may be implemented with a micro-ball array 150, on an exposed surface 132 of the substrate 106 within the cavity 126, as shown further below in FIG. 4. The pin-out pattern 130 within the cavity 126 is the same for a plurality of interposers 102, providing the advantage of manufacturing a common substrate 106. In some embodiments, the pin-out pattern 116 may have fewer electrical contacts than the pin-out pattern 130.

Although each of the die stacks 108a, 108b shown in FIGS. 1A and 1B include two dies 134 (indicated individually as dies 134a, 134b, 134c, 134d), such as NAND dies, there can be more dies 134 in each die stack 108, such as one, three, four, or more dies 134. The dies 134 in the die stacks 108 can be vertically aligned or offset (e.g., shingled) as shown, and are electrically connected to the substrate 106 and/or each other with electrical connectors 136, e.g., wires (indicated individually as electrical connectors 136a, 136b, 136c, 136d, 136e, 136f). The electrical connectors 136 connect to bond pads 138 (indicated individually as bond pads 138a, 138b, 138c, 138d) on the substrate 106. The bottom die 134b, 134d can be attached to the substrate 106 with an adhesive 140a, 140b, and the dies 134 in the die stacks 108 can be attached to each other with an adhesive (not indicated for clarity). An adhesive such as die attach film can be used, although the embodiments are not so limited.

The substrate 106 can be or include an interposer, a printed circuit board, a dielectric spacer, etc. In some embodiments, the substrate 106 can include additional semiconductor components, nonconductive components, and conductive portions such as interconnecting circuitry, through-silicon via (TSV), etc. The substrate 106 can further include electrical connectors 142a, 142b (e.g., solder balls, conductive bumps, conductive pillars, conductive epoxies, and/or other suitable electrically conductive elements) electrically coupled to a bottom surface 168 of the substrate 106 and configured to electrically couple the semiconductor device assembly 100 to an external device (not shown). Not all of the electrical connectors 142 are shown and/or indicated for clarity. In some embodiments, the substrate 106 can be formed of layers, such as prepreg, core, and prepreg as shown, providing the physical structure or firmness needed to support the semiconductor device assembly 100. The substrate 106 can include one or more signal routing structures or layers that include electrically conductive components such as traces, vias, etc., that transmit signals between the electrical connectors 136 of the dies 134, the interposer 102, and the electrical connectors 142 that convey signals to and from external components. Not all electrical connections are shown.

The semiconductor device assembly 100 can further include a mold material 144 that encapsulates at least a portion of the substrate 106, the controller 104a, the interposer 102a, and/or the first and second die stacks 108a, 108b. The mold material 144 can be a resin, epoxy resin, silicone-based material, polyimide, or any other material suitable for encapsulating and protecting these components from contaminants and/or physical damage.

Figure 2:
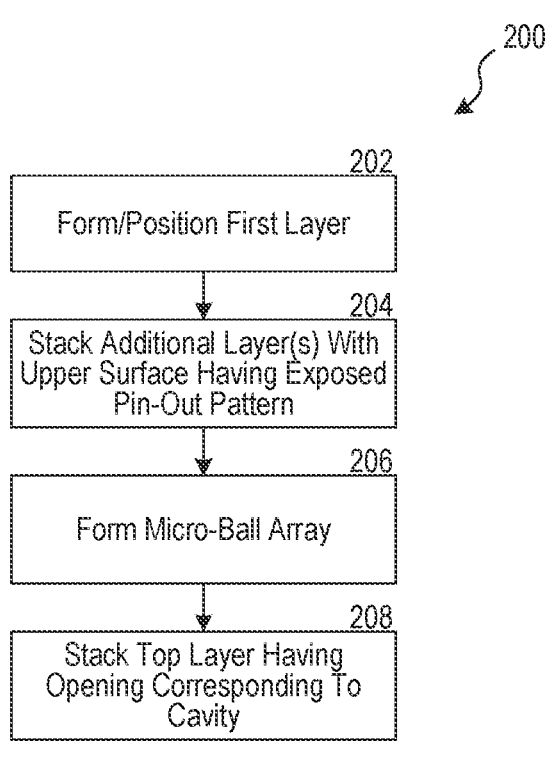
FIG. 2 is a flow chart of a method for forming the substrate of FIG. 1A that is configured to accept the interposer in accordance with the present technology.

The substrate 106 can be formed of and/or built in layers, such as by a lamination process. FIG. 2 is a simplified flow-chart of a method 200 for fabricating or assembling the substrate 106 in accordance with the present technology. FIG. 2 will be discussed together with FIG. 3 that shows a side cross-sectional view of the substrate 106 and FIG. 4 that shows a top-down view of footprints of the cavity 126 and dies stacks 108. In some embodiments, the substrate 106 can be a P450 oxidoreductase (POR) substrate that uses semiadditive fabrication process (MSAP), or other substrate technology that allows for wire-bonding.

Figure 3:
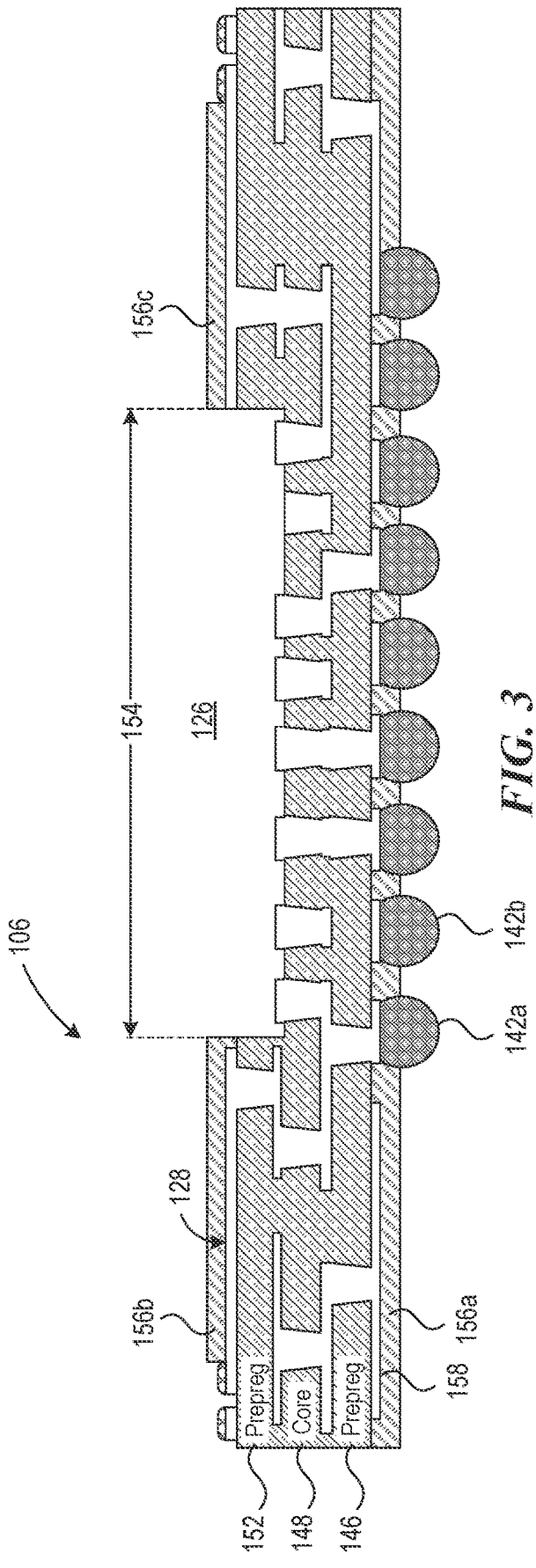
FIG. 3 is a side cross-sectional view of the substrate of FIG. 1A that is configured to accept the interposer in accordance with the present technology.

Referring to both FIGS. 2 and 3, a first layer 146 can be formed, such as with prepreg (block 202). The first layer 146 can provide for electrical interconnections to the electrical connectors 142 (e.g., solder balls). A second layer 148, such as a core layer that provides stiffness and/or structure, as well as conveyance of signals between the first layer 146 and subsequent layers can be laminated over the first layer 146 (block 204).

Figure 4:
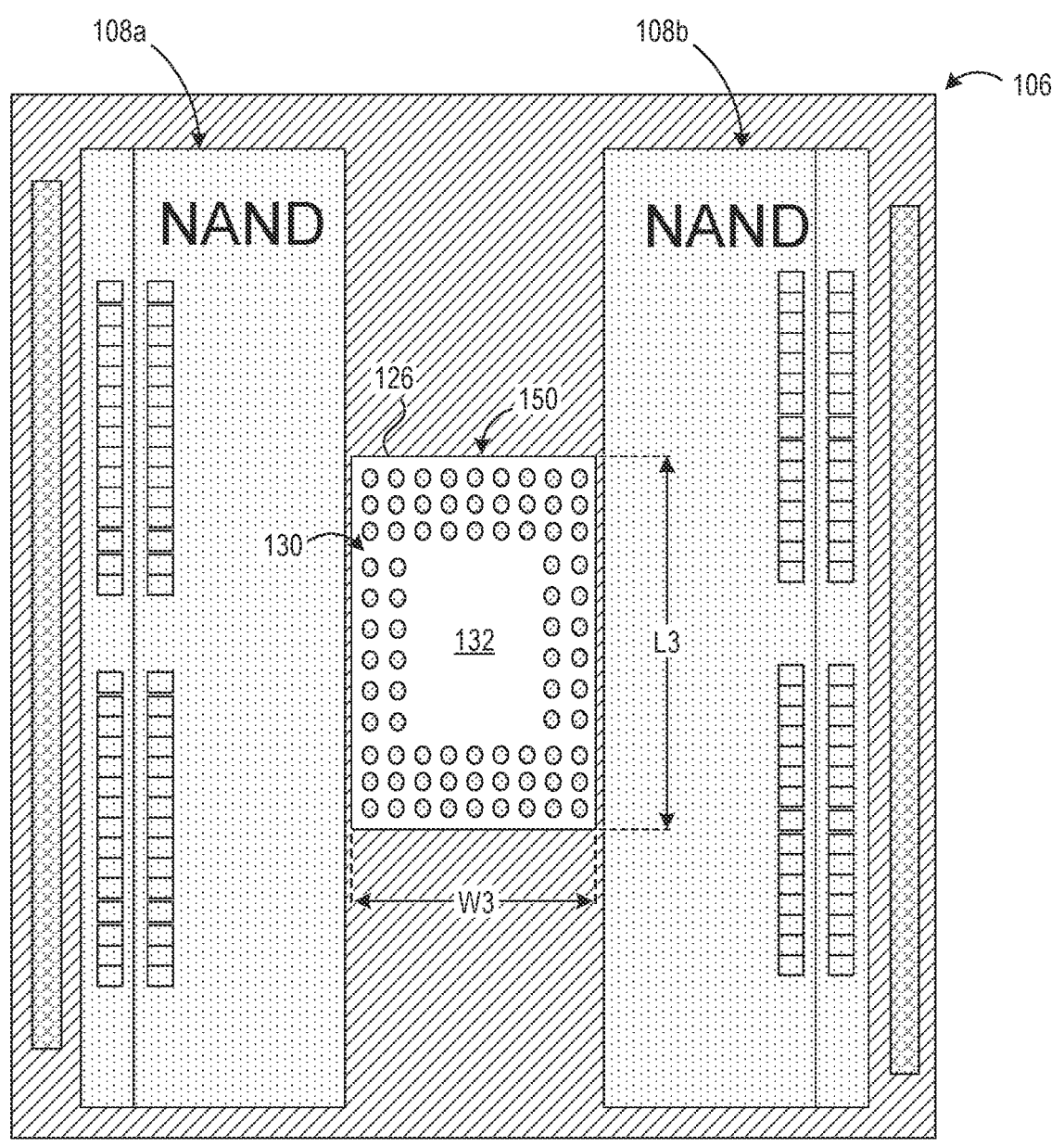
FIG. 4 is a top-down view showing a pin-out pattern on a surface of the substrate within a cavity configured to accept an interposer in accordance with the present technology.

Referring also to FIG. 4, electrical contacts, such as a micro-ball array 150, corresponding to the universal or common pin-out pattern 130 can be formed on and protrude slightly from a plane of the exposed surface 132 of the second layer 148 (or other layer that will be exposed by the cavity 126) (block 206). In some embodiments, the micro-ball array 150 can be formed on the second layer 148 before lamination. The micro-ball array 150 also corresponds to the pin-out pattern 116 on the bottom surface 118 of the interposer 102. In other embodiments, the micro-ball array 150 can be formed on a layer of the substrate 106 that is not a core layer. In yet further embodiments, the micro-ball array 150 can be formed on the interposer 102 instead of the substrate 106. It should be understood that other electrical contacts other than a micro-ball array can be used.

A third layer 152 can be laminated over the second layer 148 (block 208). The third layer 152 can be formed of prepreg, although other materials can be used. The third layer 152 can have an opening 154 formed in it that corresponds to and exposes the micro-ball array 150, effectively forming the cavity 126 of length L3 and width W3 when the third layer 152 is in place. In other embodiments, the cavity 126 can be formed after the third layer 152 has been laminated on the stack of layers forming the substrate 106, such as by removing material with a laser or other process. Additional layers (not shown) can be included in the substrate 106. In some embodiments, a solder mask 156a or passivation layer can be formed along portions of a bottom surface 158 of the first layer 146 and solder mask 156b, 156c can be applied along exposed areas of portions of the top surface 128 of the substrate 106. The electrical connectors 142, such as the solder balls, can be attached to the bottom surface 158 of the first layer 146.

Figure 5:
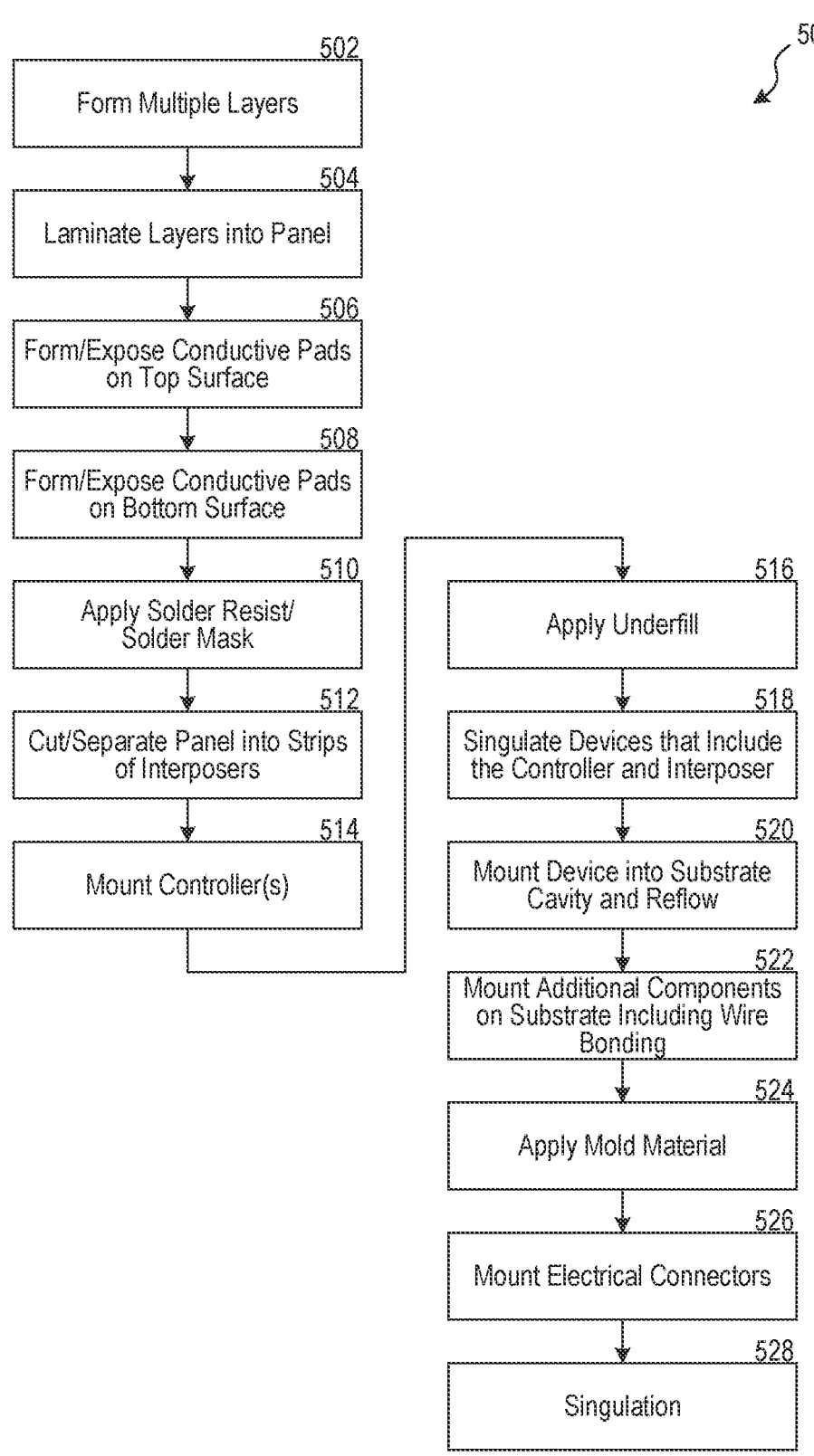
FIG. 5 is a flow chart of a method for forming a device assembly that includes the interposer and controller, and for forming the semiconductor device assembly of FIG. 1A in accordance with the present technology.
Figure 7:
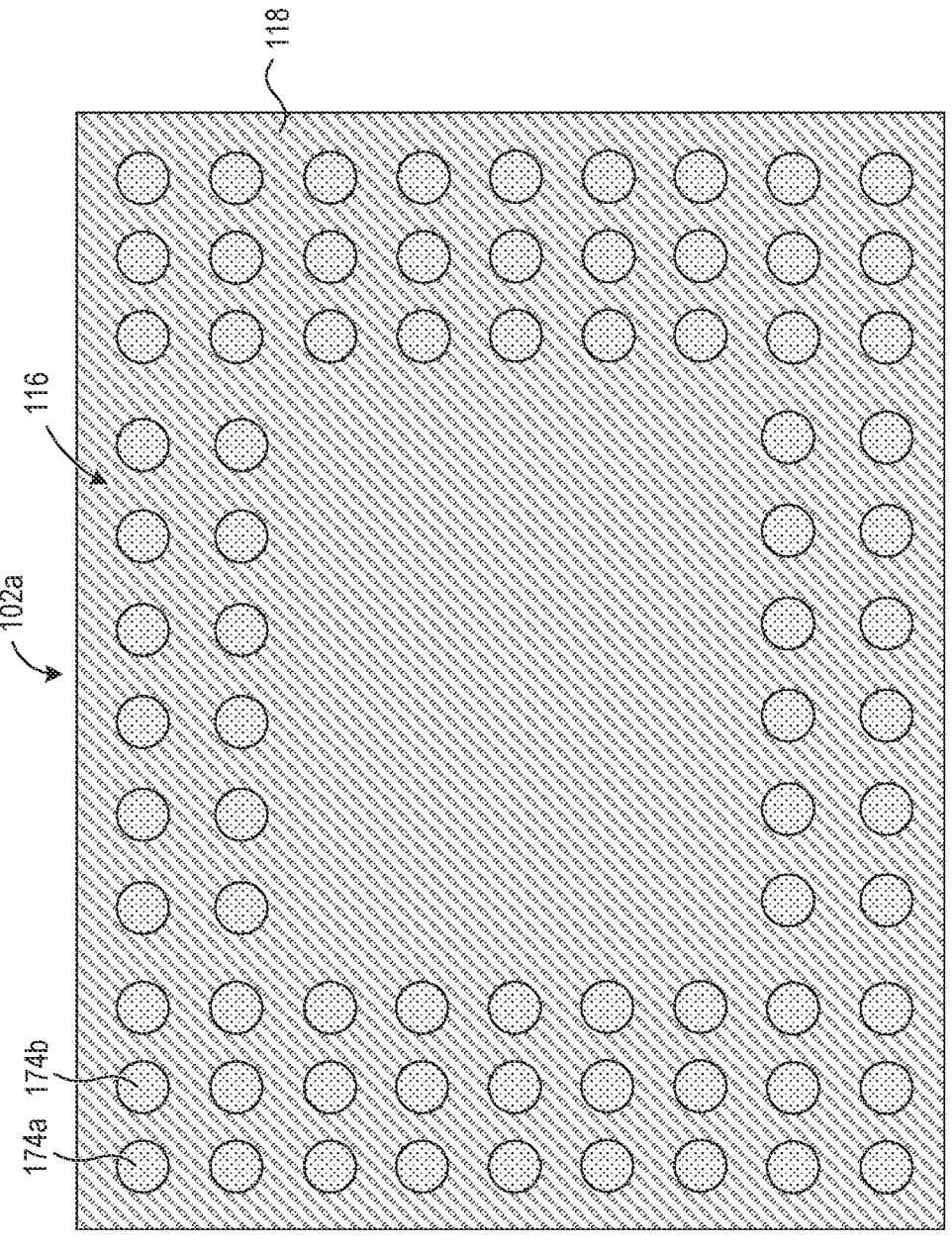
FIG. 7 is a view of a bottom surface of the interposer of FIG. 6 in accordance with the present technology.

FIG. 5 is a flow chart of a method 500 for forming the device assembly (e.g., the interposer 102 and the controller 104a) and mounting the device assembly and other components to form the semiconductor device assembly 100 in accordance with the present technology. FIG. 5 will be discussed together with FIGS. 6-8. FIG. 6 shows a device assembly 160 that includes the interposer 102a and the controller 104a, FIG. 7 shows the pin-out pattern 116 on the bottom surface 118 of the interposer 102a, and FIG. 8 shows bottom surfaces 162b, 162c, 162d of three different controllers 104b, 104c, 104d, with different respective pin-out patterns 110b, 110c, 110d.

Turning to FIG. 5, multiple layers of prepreg that include embedded conductive traces 170 (e.g., copper tracing and/or patterning) can be formed (block 502). In some embodiments, the interposer 102 can be formed of a multiple-layer ETS which can be a core-less structure. The ETS technology is known in the art, and thus various known methods, technologies, and materials can equally apply to the fabrication of the interposer 102. It should be understood that other technologies can be used to fabricate the interposer 102.

For example, the layers can be shaped and sized to form a panel when joined together. In some embodiments, the interposer 102a can be formed using layers of conductive material and dielectric such as prepreg, and forming conductive patterns in layers, such as with etching. The patterning is determined by the mapping between the controller's pin-out pattern 110a and the interposer's pin-out pattern 116, which may be the same or substantially the same as the universal pin-out pattern 130 of the substrate 106. In some cases, some electrical connections of the universal pin-out pattern 130 will not be mapped to a corresponding electrical connection of the controller's pin-out pattern 110a, wherein each electrical connection of the controller's pin-out pattern 110a that is active will be mapped to a corresponding electrical connection of the universal pin-out pattern 130.

The layers can be laminated (e.g., fused) together into a panel (block 504).

A pattern of the conductive pads 166, matching the pin-out pattern 110a of the controller 104a, can be formed and/or exposed on the top surface 114 of the interposer 102a (block 506). The conductive pads 166 will interconnect with the electrical interconnects 164 (e.g., pillars, conductive bumps, etc.) of the controller 104a.

Figure 8:
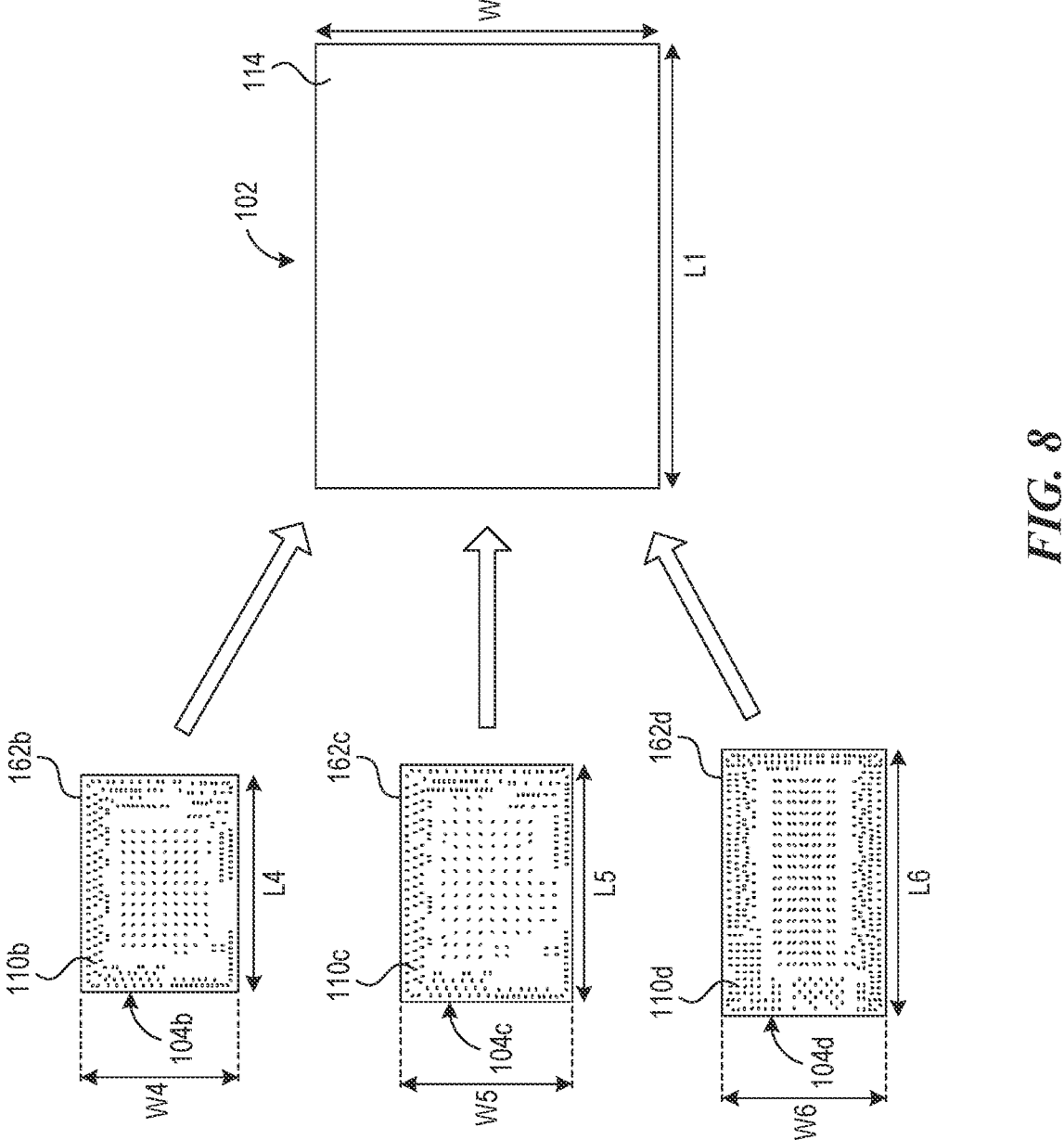
FIG. 8 shows representations of controller pin-out patterns on bottom surfaces of three different controllers in accordance with the present technology.

Referring to FIG. 8, the pin-out patterns 110b, 110c, 110c of the different controllers 104b, 104c, 104d are different with respect to each other and have different numbers of conductive bumps or pillars. The top surface 114 of the interposer 102 is also shown, although without any pin-out pattern formed thereon. Any of the pin-out patterns 110b, 110c, 110d of the controllers 104b, 104c, 104d can be provided on the top surface 114 of the corresponding interposer 102. Therefore, the controllers 104b, 104c, 104d can all interconnect with an appropriate one of the interposer 102. This provides the advantage of manufacturing a single substrate 106 that accepts multiple, different interposers 102 that are easier and cheaper to manufacture.

The length L1 and width W1 of the interposer 102 was discussed previously in FIG. 1B. Representing different sized controllers 104, the lengths and/or widths of the controllers 104 shown in FIG. 8 can be different with respect to each other. The controller 104b can have length L4 and width W4, the controller 104c can have length L5 and width W5, and the controller 104d can have length L6 and width W6. As shown, the length and width of each of the controllers 104 is less than the length L1 and width W1 of the interposer 102, although the embodiments herein are not so limited. For example, one or both of the length and width of any of the controllers 104 can be greater than the length L1 and width W1 of the interposer 102. The length L1 and width W1 of the interposer 102 can be large enough to accommodate any of the controllers 104, thereby providing the advantage of manufacturing the same size of interposer 102 and forming the same size of cavity 126 in the substrate 106.

Referring to FIGS. 4, 5, and 7, another pattern of conductive pads 174a, 174b (not all of the conductive pads 174 are indicated for clarity), matching the pin-out pattern 116 can be formed and/or exposed on the bottom surface 118 of the interposer 102 (block 508). The pin-out pattern 116 as shown is a representation only. It should be understood that the pin-out pattern 116 can have more or less conductive pads 174 than illustrated, and that the conductive pads 174 can be arranged in a grid array or other configuration. In some embodiments, the pin-out pattern 116 on the interposer 102 matches the pin-out pattern 130 of the substrate 106, while in other embodiments, the pin-out pattern 116 can have fewer electrical connectors than the pin-out pattern 130. For the greatest level of versatility, the universal pin-out pattern 130 has at least the same number of electrical connectors as does the controller 104 with the greatest number of electrical connections in its pin-out pattern 110. Further, although discussed as separate blocks, blocks 506 and 508 can also be integral with the formation of the associated layer of the interposer 102.

Returning to FIGS. 5 and 6, solder mask 172 or solder resist (not all areas are indicated) can be applied as needed to protect any exposed copper traces or other connections along the top surface 114 and bottom surface 118 of the interposer 102a (block 510).

The panel can then be cut into strips of interposers 102 (not shown) (block 512). In some embodiments, each strip can include a plurality of interposers 102 (e.g., 10 interposers 102, 100 interposers 102, more than 100 interposers 102) that provide individual controller mounting sites for a particular type of controller 104. In other embodiments, the panel can be cut into strips later in the assembly/manufacturing process.

The active surface of the controllers 104 can then be mounted (e.g., directly attached) onto the strip at each controller mounting site (not shown) (block 514), such as by using DCA technology. In some embodiments, the panel and/or panel strip will include interposers 102 that are configured to interface with a single type of controller 104, while in other embodiments, a portion of a panel or a panel strip can include interposers 102 that are configured to interface with a first type of controller 104 and a different portion with interposers 102 that are configured to interface with a second type of controller 104.

The underfill 124, such as a capillary underfill, can be flowed between each of the controllers 104 and the interposers 102 (e.g., top surface of the strip) (block 516), as shown in FIG. 6. The device assemblies 160 that include the controller 104 and interposer 102 can then be singulated (block 518).

The device assembly 160 can then be mounted into the substrate cavity 126 and reflowed to directly attach the conductive pads 174 of the interposer 102 with the micro-ball array 150 (e.g., electrical contacts) on the exposed surface 132 of the substrate 106 (block 520). In some embodiments, even though the ETS of the interposer 102 lacks the rigidity provided by a core layer, the controller 104 provides a level of structural stability, allowing the device assembly 160 to be successfully mounted.

Additional components can be mounted and/or interconnected on the substrate 106 (block 522). Referring again to FIG. 1A, the die stacks 108 can be mounted and wire bonds or other electrical connectors 136 can be accomplished.

The mold material 144 can then be applied to encapsulate the semiconductor device assembly 100, including the device assembly 160 (block 524). The mold material 144 encases the controller 104 and the dies 134 in the die stacks 108 (e.g., NAND dies). The mold material 144 also flows in open areas between side edges of the interposer 102 and the cavity 126, as well as in open areas between the bottom surface 118 of the interposer 102 and the substrate 106.

The electrical connectors 142 can be mounted on the bottom surface 168 of the substrate 106 (block 526), and the semiconductor device assemblies can be singulated (block 528).

Figure 9:
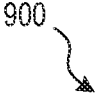
FIG. 9 is a schematic view showing a system that includes a semiconductor device assembly configured in accordance with an embodiment of the present technology.
Figure 9:
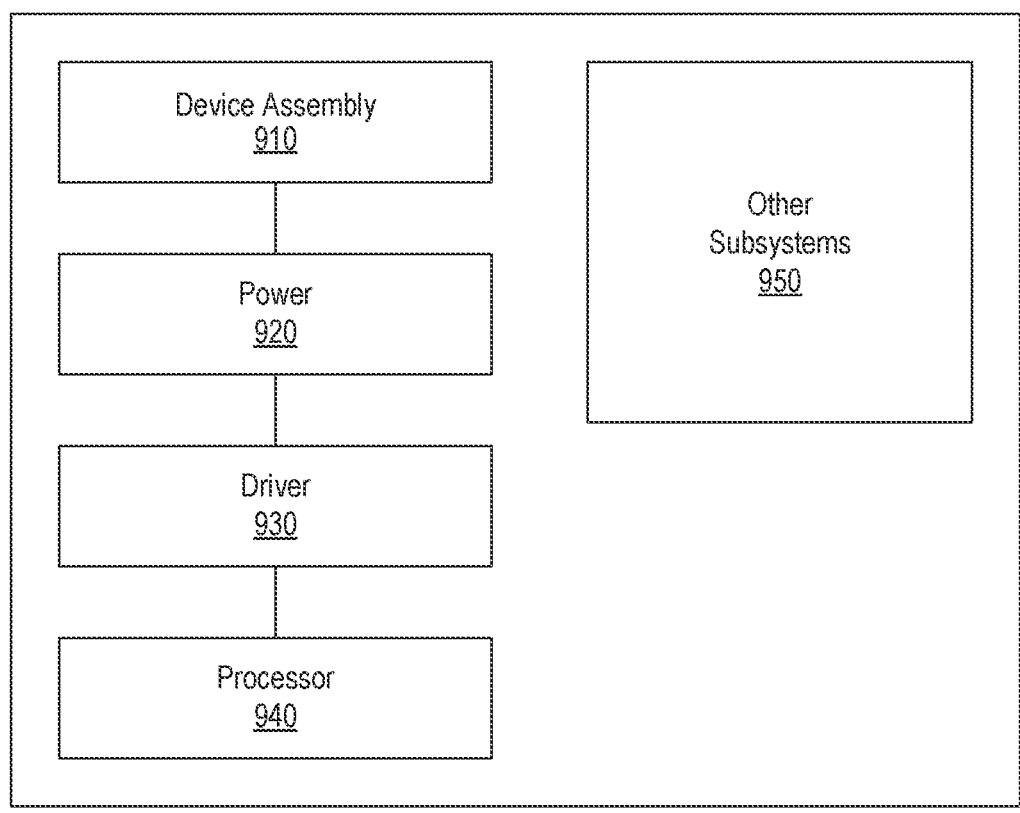

Any one of the semiconductor devices, assemblies, and/or packages described above with reference to FIGS. 1 through 8 can be incorporated into any of a myriad of larger and/or more complex systems, a representative example of which is system 900 shown schematically in FIG. 9. The system 900 can include a semiconductor device assembly 910, a power source 920, a driver 930, a processor 940, and/or other subsystems or components 950. The semiconductor device assembly 910 can include features generally similar to those of the semiconductor device assemblies described above. The resulting system 900 can perform any of a wide variety of functions such as memory storage, data processing, and/or other suitable functions. Accordingly, representative systems 900 can include, without limitation, hand-held devices (e.g., mobile phones, tablets, digital readers, and digital audio players), computers, vehicle and other machines and appliances. Components of the system 900 may be housed in a single unit or distributed over multiple, interconnected units (e.g., through a communications network). The components of the system 900 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device assembly, comprising:
   a substrate having atop surface and a bottom surface, first and second layers of prepreg disposed between the top and bottom surfaces, the first layer of prepreg being disposed closer to the top surface than the second layer of prepreg, and a core layer disposed between the first and second layers of prepreg, the substrate further comprising a cavity extending from the top surface to an intermediate depth between the top surface and the bottom surface, the cavity having an intermediate surface vertically aligned with an interface between the first layer of prepreg and the core layer;
   a controller having a first pin-out pattern; and
   an interposer having a top surface with the first pin-out pattern that is directly attached to the controller and a bottom surface having a second pin-out pattern, the interposer interconnecting at least a portion of the first and second pin-out patterns,
   wherein the interposer is configured to be directly attached to the intermediate surface of the substrate in the cavity at the intermediate depth,
   wherein the interposer has a first length less than a second length of the cavity such that a gap extends between a side edge of the interposer and a facing sidewall of the cavity, and
   wherein the second pin-out pattern of the interposer is directly attached to corresponding electrical contacts on the intermediate surface of the substrate having the second pin-out pattern.

2. The semiconductor device assembly of claim 1, wherein the bottom surface of the interposer is disposed entirely within the cavity.

3. The semiconductor device assembly of claim 1, wherein the first and second pin-out patterns are different patterns.

4. The semiconductor device assembly of claim 1, wherein the interposer is further configured to redistribute the first pin-out pattern to the second pin-out pattern, and wherein the second pin-out pattern has a different pitch than the first pin-out pattern.

5. The semiconductor device assembly of claim 1, wherein the interposer is further configured to redistribute the first pin-out pattern to only a portion of the second pin-out pattern.

6. The semiconductor device assembly of claim 1, wherein the interposer comprises an embedded trace substrate.

7. The semiconductor device assembly of claim 1, wherein the interposer further comprises at least one via.

8. The semiconductor device assembly of claim 1, wherein the interposer has a larger footprint than a footprint of the controller.

9. The semiconductor device assembly of claim 1, wherein the electrical contacts on the surface of the substrate comprise a micro-ball array.

10. A semiconductor device assembly, comprising:

a substrate having a top surface and a bottom surface, first and second layers of prepreg disposed between the top and bottom surfaces, the first layer of prepreg being disposed closer to the top surface than the second layer of prepreg, and a core layer disposed between the first and second layers of prepreg, the substrate further comprising a cavity extending into the substrate from the top surface, the cavity having an intermediate surface vertically aligned with an interface between the first layer of prepreg and the core layer;

a controller having a first pin-out pattern;

an interposer having a top surface with the first pin-out pattern that is connected to the controller and a bottom surface having a second pin-out pattern, the interposer interconnecting the first and second pin-out patterns, wherein the second pin-out pattern of the interposer is directly attached to the intermediate surface of the substrate in the cavity;

at least one memory die attached to the top surface of the substrate; and mold material at least partially encapsulating the top surface of the substrate, the controller, the interposer, and the at least one memory die, wherein the interposer has a first length less than a second length of the cavity such that a gap extends between a side edge of the interposer and a facing sidewall of the cavity.

11. The semiconductor device assembly of claim 10, wherein the interposer comprises an embedded trace substrate.

12. The semiconductor device assembly of claim 10, wherein the first and second pin-out patterns are different.

13. The semiconductor device assembly of claim 10, wherein the interposer comprises prepreg.

14. The semiconductor device assembly of claim 1, wherein a mold material is disposed in the gap.

15. The semiconductor device assembly of claim 10, wherein a mold material is disposed in the gap.

* * * * *